(12) United States Patent
Nandakumar et al.

(10) Patent No.: US 6,713,334 B2
(45) Date of Patent: Mar. 30, 2004

(54) FABRICATING DUAL VOLTAGE CMOSFETS USING ADDITIONAL IMPLANT INTO CORE AT HIGH VOLTAGE MASK

(75) Inventors: Mahalingam Nandakumar, Plano, TX (US); Youngmin Kim, Allen, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 10/215,925

(22) Filed: Aug. 9, 2002

(65) Prior Publication Data

US 2003/0040148 A1 Feb. 27, 2003

Related U.S. Application Data

(60) Provisional application No. 60/313,817, filed on Aug. 22, 2001.

(51) Int. Cl.$^7$ .......................................... H01L 21/8238
(52) U.S. Cl. ................. 438/199; 438/217; 438/275; 438/305; 438/450
(58) Field of Search .................. 257/501, 506, 257/544; 438/163, 181, 199, 200, 207, 217, 218, 219, 225, 275, 286, 289, 291, 294, 298, 301, 304, 305, 306, 362, 427, 443, 450, 451

(56) References Cited

U.S. PATENT DOCUMENTS

| | | | | |
|---|---|---|---|---|
| 5,399,508 A | * | 3/1995 | Nowak | 438/291 |
| 5,472,887 A | * | 12/1995 | Hutter | 438/231 |
| 6,362,049 B1 | * | 3/2002 | Cagnina | 438/258 |

* cited by examiner

*Primary Examiner*—Kamand Cuneo
*Assistant Examiner*—Asok Kumar Sarkar
(74) *Attorney, Agent, or Firm*—Peter K. McLarty; W. James Brady, III; Frederick J. Telecky, Jr.

(57) ABSTRACT

An implant at HVGX pattern (step 102c) is provided to allow selective transistor threshold voltage Vth adjustment on the core transistors without affecting the I/O transistor threshold voltage Vt. The implant provides independently tuned either NMOS core transistors and I/O transistor Vth or PMOS core transistors and I/O transistor Vth.

2 Claims, 2 Drawing Sheets

FABRICATING DUAL VOLTAGE CMOSFETS USING ADDITIONAL IMPLANT INTO CORE AT HIGH VOLTAGE MASK

This application claims priority under 35 USC §119(e)(1) of provisional application Ser. No. 60/313,817, filed Aug. 22, 2001.

FIELD OF INVENTION

This invention relates generally to semiconductor devices and more particularly to semiconductor devices having both high and low voltage semiconductors and more particularly to using an additional implant into NMOS and PMOS low voltage devices at high voltage mask to enable a mask saving.

BACKGROUND OF INVENTION

It is often desirable that a semiconductor device chip have two types or sizes of Complementary Metal-oxide Semiconductor (CMOS) transistors on a single chip with one type adapted for operation at a low supply voltage and another type adapted for a higher supply voltage. The low supply voltage transistors, referred to herein as the core transistors, are used internal to the chip. Core transistors are smaller and have a thin gate oxide layer to maximize speed at low voltage. These transistors are usually in the central part of the chip and are optimized with the current state of process engineering for packing density and highest performance. The high supply voltage transistors are usually used to communicate to external devices/chips and are hence referred to as the I/O (input/output) transistors. These transistors are larger, and have a thicker gate oxide layer for reliable high voltage operation. The use of two different supply voltages demands the different gate oxide thickness. A description of such chips and the high and low supply voltage transistors can be found in U.S. Pat. No. 5,472,887 of Hutter et al. This patent is incorporated herein by reference. Variations between implants received by the core transistors and the I/O transistors have required the use of two separate masks, optimizing both sets requires 4–5 additional masks. Tests using identical implants for both the low voltage and high voltage transistors, while preferable from a fabrication standpoint, do not provide high voltage transistors that meet the necessary lifetime and performance specifications. The high Medium Drain Doping (MDD) necessary to the core transistors causes the periphery I/O transistors to have too high an electrical field, even though the oxide thickness is increased for these transistors.

FIG. 1 illustrates a PMOS core transistor. This PMOS core transistor has a gate width of 0.1 to 0.15 micron and an oxide layer of 20 to 40 Angstroms above the channel.

FIG. 2 illustrates the larger I/O transistor which has a gate width of 0.3 to 1.0 micron and which has an oxide layer (SiO2 for example) of about 70 to 100 Angstroms. The I/O transistor device is a 3 to 4 times thicker device. As stated previously the High Medium Drain Doping for the core transistors causes too high an electric field for the I/O transistors. The implant voltage Vt is therefore incompatible between the low supply voltage core transistor and the higher supply voltage I/O transistor (i.e. ability to set target Vts on core transistor and I/O transistor) because the Vt decreases as core oxide gets thinner. In particular, for PMOS with silicon dioxide (SiO2) gate dielectric, the I/O transistor threshold voltage (Vt) is too high while the core transistor threshold voltage (Vt) is at target value (typical phosphorus Vt implant dose is greater than 6.5e12 @ 20 KeV for core transistor Vt at a 10 um long channel of 0.4 V gives I/O Vt of 0.9 V and that is too high). To lower the I/O transistor Vt to acceptable limit ≈0.5–0.6 V we have the following choices:

1. Counterdope the I/O with thru-gate implant at PLDD2 (PMOS Lightly Doped Drain) and NLDD2.
2. Use lower Vt dose≈4e12 @70 KeV and higher pocket dose on PMOS core. Don't need additional mask but results in PMOS core performance degradation≈2.5%.
3. Thru-gate implant on PMOS core. Polysilicon thickness differences over active between SRAM and logic. Vt non-uniformities on core could result.

SUMMARY OF INVENTION

In accordance with one embodiment of the present invention a low threshold voltage Vt implant on PMOS device and then add an additional implant into the core at the HVGX pattern mask. An implant at HVGX pattern is provided to allow selective Vth adjustment on the core transistors without affecting the I/O transistor Vt. The implant provides independently tuned either NMOS core and I/O Vth or PMOS core and I/O Vth.

DESCRIPTION OF PREFERRED EMBODIMENT OF THE PRESENT INVENTION

A dual supply voltage CMOS device with both PMOS and NMOS transistors is described in connection with the Hutter et al patent cited above and incorporated herein by reference. In accordance with a preferred embodiment of the present invention an implant at HVGX pattern is provided to allow selective threshold voltage Vth adjustment on the core transistors without affecting the I/O transistor threshold voltage Vt. The implant provides independently tuned either NMOS core transistors and I/O transistor Vth or PMOS core transistors and I/O transistor Vth. The process eliminates additional Vt adjustment implant which is typically performed at LDD2 loop (drain extension implants) to adjust I/O Vt selectively, and furthermore allows the removal of one of I/O drain extension pattern step, e.g., nLDD2 or pLDD2 pattern, if the I/O drain extension can be formed without the pattern. For example, the drain extensions can be formed by a blanket implant or skipping the implant at the expense of transistor performance.

Figure 1:
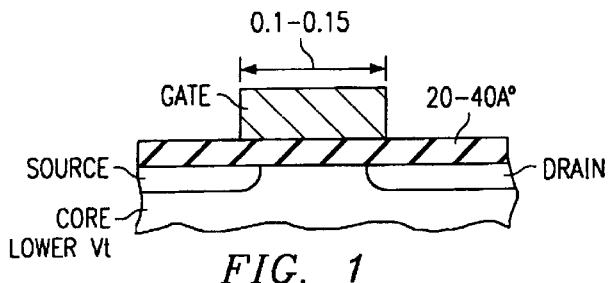
FIG. 1 illustrates a low voltage or core PMOS transistor according to the prior art.
Figure 2:
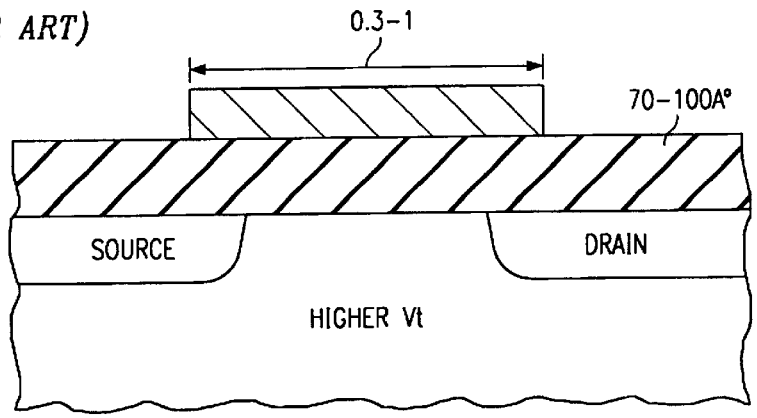
FIG. 2 illustrates a high voltage or I/O PMOS transistor according to the prior art.
Figure 3:
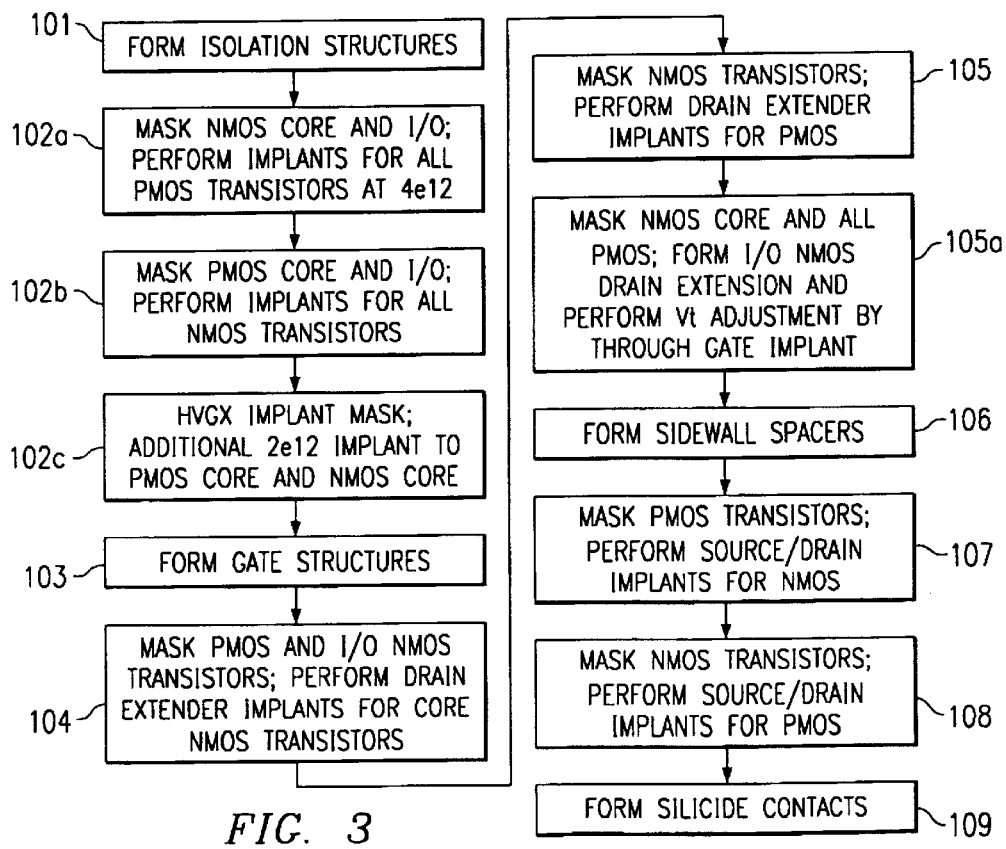
FIG. 3 illustrates the improved process steps for fabricating both low and high voltage MOS transistors according to one embodiment of the present invention.

Referring to FIG. 3 there is illustrated the process according to one embodiment of the present invention. The process begins with (Step 101) the formation of isolation structures (not shown). These can be LOCOS (local oxidation of silicon) oxidations, shallow trench isolation, or other schemes. A thin disposable oxide is generally grown to protect the silicon surface during implants. The next step (102) is the channel implants.

Figure 4:
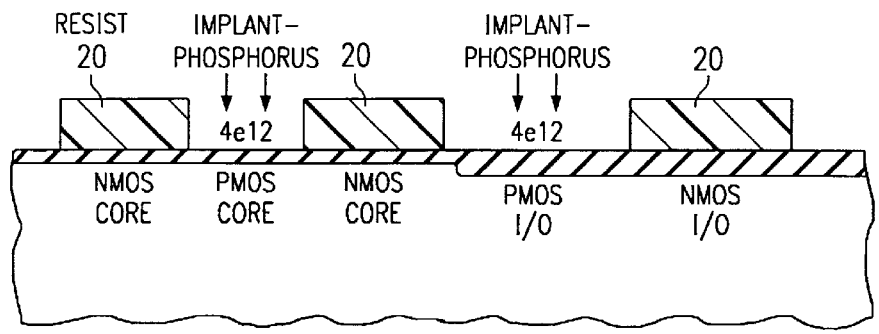
FIG. 4 illustrates the process step 102a in FIG. 3.

In accordance with an embodiment of the present invention for the silicon dioxide (SiO2) dielectric where the PMOS Vt is too high to first implant the core transistors and the I/O transistors together and keep the implant voltage Vt down and later do an additional implant into the core transistors. The procedure is as follows: A photo-resist (20 in FIG. 4) is deposited and patterned to cover the NMOS transistors and expose all the PMOS transistors (Step 102*a*). An initial phosphorus Vtp implant of 4e12@ 20 KeV to set the Vt of the PMOS I/O at 0.5–6 V(Step 102*b*). This is allowing integration of a PMOS I/O transistor and PMOS core transistor into a CMOS floor without adding an extra mask. See FIG. 4. In Step 102*b*, a photo-resist is then deposited and patterned to cover the PMOS transistors and expose the NMOS transistor. An NMOS Vtn implant of 6e12@70 KeV (higher than the normal 4e12 baseline) is then performed. See FIG. 5. In step 102*c* core N/PMOS are uncovered while I/O transistors is covered by the resist (HVGX pattern). An additional phosphorus implant of≈2e12 @20 KeV is done with HVGX mask. See FIG. 6. The HVGX implant mask for the high voltage I/O devices is already present in the process and therefore represents no additional mask. Both NMOS core transistors and PMOS core transistors are exposed to this implant. This additional implant will set the PMOS core transistor Vt without increasing the PMOS I/O transistor Vt. Also, the boron Vt dose on the NMOS core, which was set higher than target at the step of FIG. 5, will be compensated later (Step 105*a*) with the phosphorus implant to ensure correct NMOS core Vt. After the implant at Step 102C, the oxide in core transistor is etched off, the photoresist is removed and a gate oxide is grown to 24 to 40 Angstroms.

As gate dielectric, either oxide or nitrided oxide can be used and either polysilicon or metal gate can be used as gate materials. Generally, all gates will be a single layer of polysilicon, although differently doped layers may be used to form the PMOS and NMOS gates.

In the next step (Step 104) the PMOS transistors are then masked while drain extender implants are performed for the NMOS transistors. The mask may be modified to also cover the higher voltage transistors so they do not receive the drain extender implant. This is followed by the step (Step 105) of masking all NMOS transistors while the PMOS transistors receive their drain extender implants. For more on removing the drain extender implant from the high voltage devices see application Ser. No. 09/593,762 filed Jun. 14, 2000 of Vasanth entitled "Integrating Dual Supply Voltage By removing the Drain Extender Implant From the High Voltage Device". This application is incorporated herein by reference.

Figure 5:
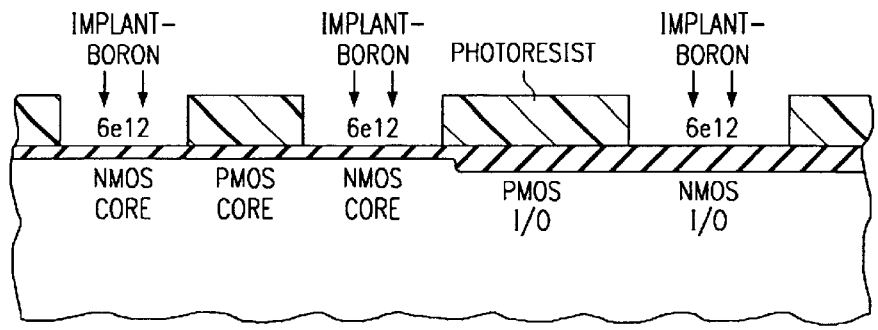
FIG. 5 illustrates the process step 102b in FIG. 3.
Figure 6:
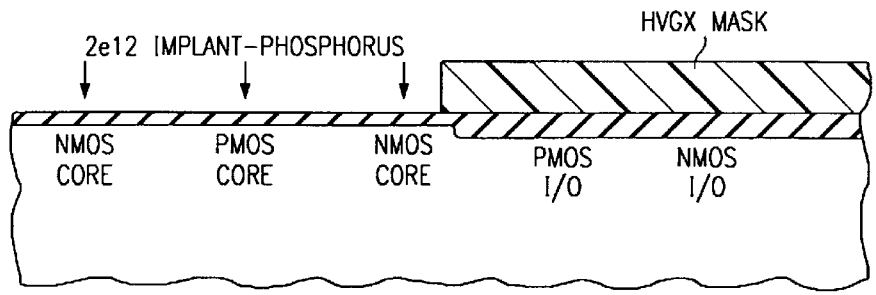
FIG. 6 illustrates the process step 102c in FIG. 3.
Figure 7:
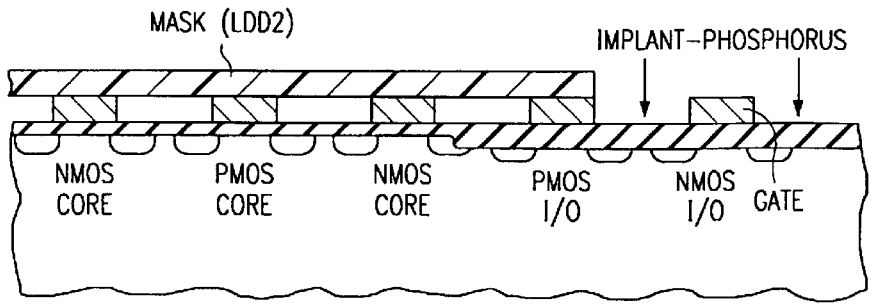
FIG. 7 illustrates the process step 105a in FIG. 3.

Since the core and I/O NMOS share the channel implant as FIG. 5, I/O Vt typically ends up with a higher value than desired because the channel implant is usually set up for core transistor optimization. To lower the I/O Vt, additional Vt adjustment implant is performed at nLDD2 pattern, which masks all other transistor, such as core NMOS and all PMOS, except I/O NMOS. This is illustrated in FIG. 7. See FIG. 3 Step 105*a* which occurs after the mask from step 105 is removed. However, at the time of the nLDD2 pattern the poly gate is already formed, thus a high energy phosphorus implant is needed to implant through the polysilicon gate and to counterdope the boron in the channel. This mask is available in the current process. This present invention can eliminate additional Vt adjustment implant which is typically performed at LDD2 loop (drain extension implants) to adjust I/O Vt selectively, and furthermore allows the removal of one of I/O drain extension pattern step, e.g., nLDD2 or pLDD2 pattern, if the I/O drain extension can be formed without the pattern. For example, the drain extensions can be formed by a blanket implant or skipping the implant combined with proper S/D (source/drain) profiles at the expense of transistor performance. In the case of pLDD2 a blanket Boron or BF2 implant adjustment may be used.

Sidewall spacers are then formed (Step 106) on all transistors with preferably the same spacer being used for all transistors. This is followed by source/drain implants (step 107), first for the NMOS transistors, then for the PMOS transistors (step 108). With the lack of a drain extender implant on the high voltage transistors, it is necessary to adjust both the gate sidewall spacer thickness and source/drain implant conditions from the conditions optimized for the core transistors. It is taught by the referenced application that an angled implant with arsenic and phosphorus is needed to provide the gradation needed by the HV transistor. The angles implant must not overrun the MDD in the core transistors, but must have some overlap in the HV. This is generally followed by formation of silicide contacts on the gate and on the source/drain areas. Fabrication then comes with deposition of a dielectric and metalization steps.

Finally, a silicide is then formed on the upper surface of the gate and on the source/drain areas (step 109) to provide contacts, and a dielectric layer is deposited. Processing then continues with metalization to provide the desired connections for the transistors.

While this invention has been describes with a preferred embodiments, this description is not intended to be construed in a limiting sense. Various modifications and combinations of the illustrative embodiments of the invention will be apparent to persons skilled in the art upon reference to the description. It is, therefore, intended that the appended claims encompass such modifications or embodiments.

What is claimed is:

1. A method of fabricating low and high voltage CMOS transistors comprising the steps of:

masking all core NMOS and I/O NMOS transistors;

implanting both core PMOS and I/O PMOS transistors;

removing mask from core NMOS transistors I/O NMOS transistors and masking core PMOS transistors and I/O PMOS transistors;

implanting both core and I/O NMOS transistors; and masking all I/O NMOS transistors and I/O PMOS transistors and simultaneously implant phosphorus in both NMOS and PMOS core transistors.

2. The method of claim 1 further comprising implanting phosphorus in I/O NMOS transistor.

* * * * *